(12) United States Patent
Karlin et al.

(10) Patent No.: US 8,921,203 B2
(45) Date of Patent: Dec. 30, 2014

(54) METHOD OF FORMING AN INTEGRATED CIRCUIT HAVING VARYING SUBSTRATE DEPTH

(71) Applicants: Lisa H. Karlin, Chandler, AZ (US); Hemant D. Desai, Gilbert, AZ (US); Kemiao Jia, Phoenix, AZ (US)

(72) Inventors: Lisa H. Karlin, Chandler, AZ (US); Hemant D. Desai, Gilbert, AZ (US); Kemiao Jia, Phoenix, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/750,419

(22) Filed: Jan. 25, 2013

(65) Prior Publication Data

US 2013/0285161 A1  Oct. 31, 2013

Related U.S. Application Data

(60) Provisional application No. 61/639,487, filed on Apr. 27, 2012.

(51) Int. Cl.
*H01L 21/30* (2006.01)

(52) U.S. Cl.
USPC .......... 438/459; 438/455; 438/456; 257/415; 257/416

(58) Field of Classification Search
CPC ............... H01L 21/76251; H01L 21/76254; H01L 21/2007; H01L 21/76256; H01L 2924/14
USPC ........ 438/50, 64–65, 455–459; 257/415–416, 257/704, 729
See application file for complete search history.

(56) References Cited

U.S. PATENT DOCUMENTS

| 6,524,931 | B1 | 2/2003 | Perera |
| 6,664,126 | B1 | 12/2003 | Devoe et al. |
| 6,955,988 | B2 | 10/2005 | Nevin et al. |
| 8,546,934 | B2 * | 10/2013 | Von Koblinski et al. ..... 257/704 |
| 2007/0085195 | A1 * | 4/2007 | Lee et al. ................. 257/704 |
| 2008/0164573 | A1 * | 7/2008 | Basker et al. ............. 257/621 |
| 2009/0321863 | A1 * | 12/2009 | Borthakur et al. .......... 257/432 |
| 2012/0210175 | A1 * | 8/2012 | Ben-Yehuda et al. ....... 714/47.1 |
| 2012/0255357 | A1 * | 10/2012 | Chen et al. ............... 73/514.31 |

OTHER PUBLICATIONS

Cho, J. et al., "Single-Crystal-Silicon Vibratory Cylinderical Rate Integrating Gyroscope," IEEE Transducers 2011, Bejing, China; Jun. 5-9, 2011, pp. 2813-2816.

* cited by examiner

*Primary Examiner* — Dung A. Le

(57) ABSTRACT

A method for forming a semiconductor device includes providing a substrate having a first major surface and a second major surface, removing a first portion of the substrate to form a cavity at the first major surface of the substrate, bonding the first major surface of the substrate to a carrier substrate after forming the cavity, and reducing a thickness of the substrate. The method further includes forming a first accelerometer device at the second major surface such that at least a portion of the first accelerometer device is over the cavity and forming a second accelerometer device at the second major surface such that the second accelerometer device is not disposed over the cavity.

17 Claims, 4 Drawing Sheets

METHOD OF FORMING AN INTEGRATED CIRCUIT HAVING VARYING SUBSTRATE DEPTH

CROSS-REFERENCE TO RELATED APPLICATION

The present application is a Non-Provisional of U.S. Provisional Patent Application No. 61/639,487, entitled "INTEGRATED CIRCUIT HAVING VARYING SUBSTRATE DEPTH AND METHOD OF FORMING SAME" filed on Apr. 27, 2012, the entirety of which is herein incorporated by reference.

BACKGROUND

1. Field of the Disclosure

The present disclosure relates to semiconductor devices, and more particularly to formation of semiconductor devices.

2. Description of the Related Art

The behavior of a semiconductor device can be affected by the thickness of a device substrate. For example, the stiffness of an accelerometer spring can be determined, in part, by the thickness of the substrate layer associated with the spring. The stiffness of the accelerometer spring can also affect other attributes of the device behavior, such as the sensitivity of the accelerometer.

BRIEF DESCRIPTION OF THE DRAWINGS

Embodiments are illustrated by way of example and are not limited in the accompanying figures.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the invention.

DETAILED DESCRIPTION

A semiconductor device is formed such that a semiconductor substrate of the device has a non-uniform thickness. In one embodiment, a cavity is etched at a selected side of the semiconductor substrate, and the selected side is then fusion bonded to another substrate, such as a carrier substrate. After fusion bonding, the side of the semiconductor substrate opposite to the selected side is ground to a defined thickness relative to the cavity. Accordingly, the semiconductor substrate has a uniform thickness except in the area of the cavity, where the substrate is thinner. Devices that benefit from a thinner substrate can be formed over the cavity. For example, in one embodiment X-axis and Y-axis accelerometer springs are formed at thicker regions of the semiconductor substrate, while a Z-axis accelerometer spring is formed at the thinner region. The relative thinness of the area over the cavity provides the Z-axis accelerometer with more sensitivity than if the spring were formed at the thicker region of the substrate.

Figure 1:
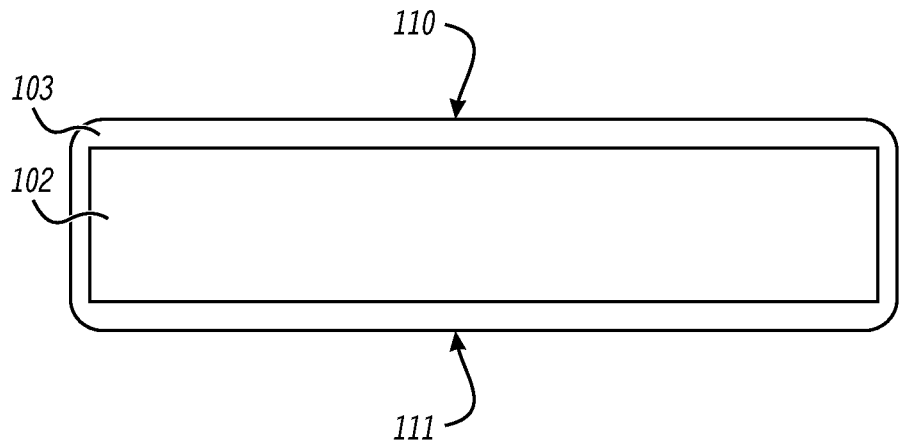
FIG. 1 includes an illustration of a cross-sectional view of a semiconductor substrate in accordance with one embodiment of the present disclosure.

FIG. 1 includes an illustration of a cross-sectional view of a semiconductor device that includes a semiconductor substrate 102 having a major surface 110, referred to as frontside 110, and a major surface 111, referred to as the backside 111. As illustrated, the frontside 110 is on the opposite side of the backside 111. The substrate 102 can be a monocrystalline semiconductor wafer, a semiconductor-on-insulator wafer, a flat panel display (e.g., a silicon layer over a glass plate), or other substrate conventionally used to form electronic devices. The frontside 110 is a surface of the substrate 102 at which electronic components are typically formed.

In the illustrated embodiment, the substrate 102 includes an insulating layer 103 that surrounds both the frontside 110 and the backside 111. The insulating layer 103 can include an oxide, a nitride, other dielectrics, or any combination thereof. In one embodiment, the insulating layer is formed by thermal oxidation. The semiconductor substrate 102 illustrated at FIG. 1. can be 600 micrometers thick, with the insulating layer 103 having a nominal thickness of 1 micrometer.

Figure 2:
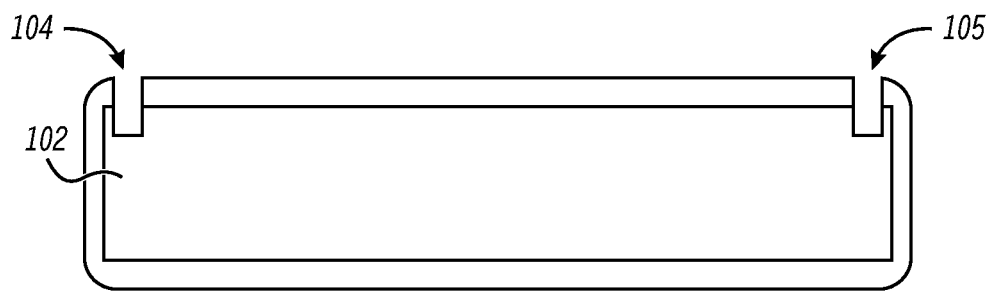
FIG. 2 includes an illustration of a cross-sectional view of the semiconductor substrate of FIG. 1 after forming alignment marks in accordance with one embodiment of the present disclosure.

In FIG. 2, alignment marks 104 and 105 have been etched at the frontside 110 of the semiconductor substrate 102. In an embodiment, the alignment marks 104 and 105 are etched by first patterning the insulating layer 103 using a photoresist mask to define openings at the insulating layer 103 corresponding to the alignment marks 104 and 105. After patterning, oxide etching is performed to remove portions of the insulating layer 103 corresponding to the defined openings. Silicon etching is then performed to form the alignment marks 104 and 105 at the semiconductor substrate 102. The photoresist is then stripped by application of a chemical solution, by application of plasma, or a combination thereof.

Figure 3:
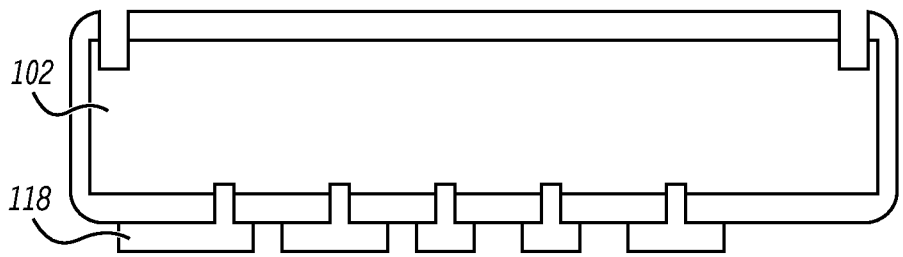
FIG. 3 includes an illustration of a cross-sectional view of the semiconductor substrate of FIG. 2 after forming interconnects in accordance with one embodiment of the present disclosure.

In FIG. 3, polysilicon runners, such as polysilicon runner 118, are formed to overlay the backside 111. The polysilicon runners are formed by patterning the insulating layer 103 using a photoresist mask to define openings corresponding to locations where the polysilicon runners are to connect to the semiconductor substrate 102. After patterning the insulating layer 103, oxide etching or other etching is performed to remove portions of the insulating layer 103 corresponding to the defined openings. A polysilicon layer is then deposited over the insulating layer 103 at the backside 111. In an embodiment, the polysilicon layer has a thickness of 2.5 micrometers. The polysilcon layer is then patterned using a photoresist mask to define the shapes of the polysilicon runners. Polysilicon etching is then performed to form the defined shapes. The photoresist is then stripped by application of a chemical solution, by application of plasma, or a combination thereof. The polysilicon can be used to provide interconnects for devices subsequently formed at the semiconductor substrate 102 and to provide mechanical support for the semiconductor substrate 102.

Figure 4:
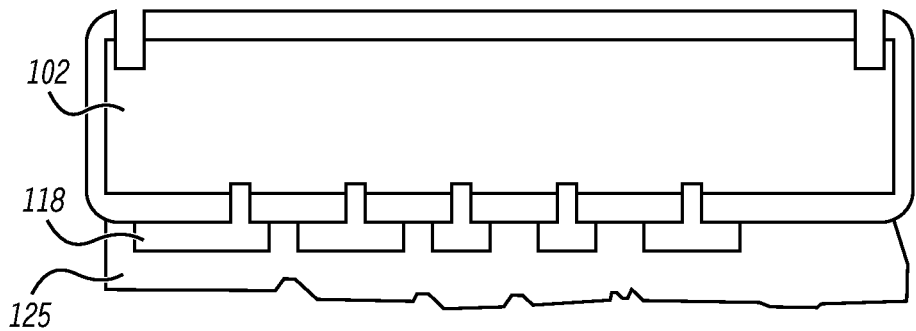
FIG. 4 includes an illustration of a cross-sectional view of the semiconductor substrate of FIG. 3 after forming an insulating layer in accordance with one embodiment of the present disclosure.

In FIG. 4 an insulating layer 125 is then deposited over the polysilicon runners and the insulating layer 103 along the backside 111. The insulating layer 103 can include an oxide, a nitride, an oxynitride, or any combination thereof. In one embodiment, the insulating layer 125 is an oxide formed at the device using a plasma-enhanced chemical vapor deposition (PECVD) process.

Figure 5:
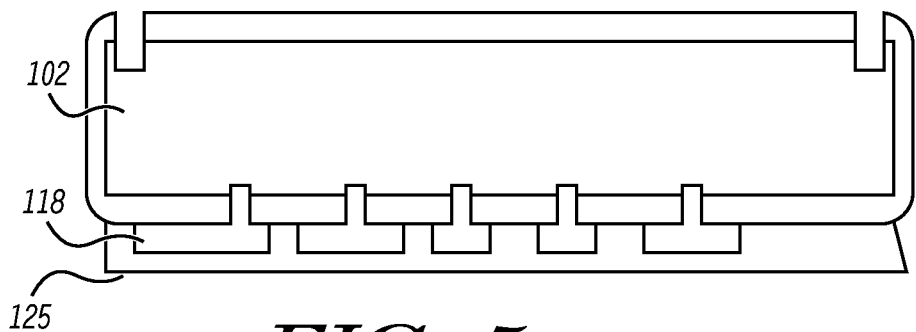
FIG. 5 includes an illustration of a cross-sectional view of the semiconductor substrate of FIG. 4 after planarization of the insulating layer in accordance with one embodiment of the present disclosure.

In FIG. 5, the insulating layer 125 is then polished to a defined thickness. In an embodiment, the thickness of the insulating layer 125 is 0.5 micrometers. The polishing can be done, for example, by chemical mechanical polishing (CMP) or other polishing technique.

Figure 6:
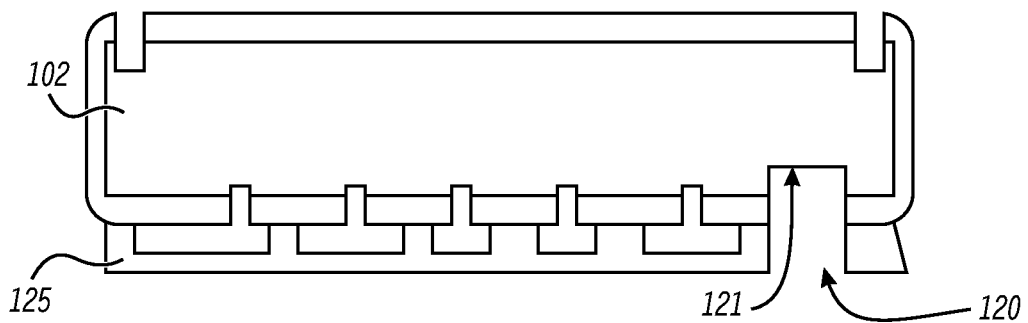
FIG. 6 includes an illustration of a cross-sectional view of the semiconductor substrate of FIG. 5 after forming a backside cavity in accordance with one embodiment of the present disclosure.

In FIG. 6, a cavity 120 is then formed to lie within the semiconductor substrate 102. The cavity 120 is formed by patterning the insulating layer 125 to define an opening corresponding to the cavity 120. After patterning, oxide etching is performed to remove portions of the insulating layer 125 and the insulating layer 103 corresponding to the defined opening. Silicon etching is then performed to form the cavity 120 at the semiconductor substrate 102. The photoresist is then stripped by application of a chemical solution, by application of plasma, or a combination thereof. The wafer is then cleaned and prepared for the bonding step.

Cavity 120 is formed such that it defines an opening in the backside 111 of the semiconductor substrate 102. The face of the cavity 120 that runs generally parallel to the frontside 110 and defines the depth of the cavity is referred to as the bottom 121 of the cavity 120. In an embodiment, the depth of the cavity 120, from the opening in the backside 111 to the bottom 121, is 10 micrometers.

Figure 7:
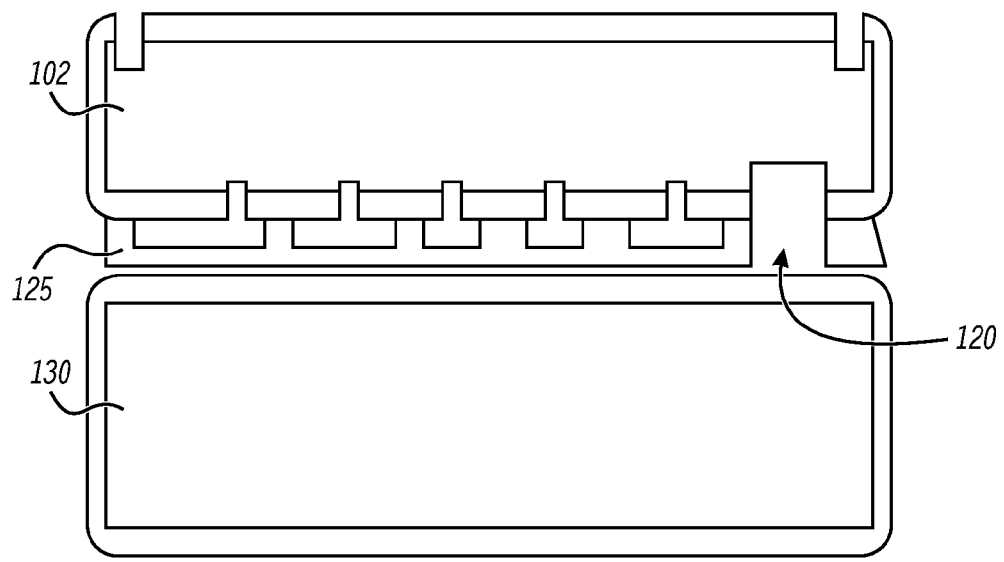
FIG. 7 includes an illustration of a cross-sectional view of the semiconductor substrate of FIG. 6 after fusion bonding of the semiconductor substrate to a carrier substrate in accordance with one embodiment of the present disclosure.

In FIG. 7, the insulating layer 125 is then bonded to a substrate 130. The bond can be formed by fusion bonding, chemical bonding, and the like. The substrate 130 can be a carrier substrate or other substrate. The substrate 130 is bonded such that it is opposite the frontside 110 of the semiconductor substrate 110. The substrate 130 provides mechanical support for the semiconductor substrate 102.

Figure 8:
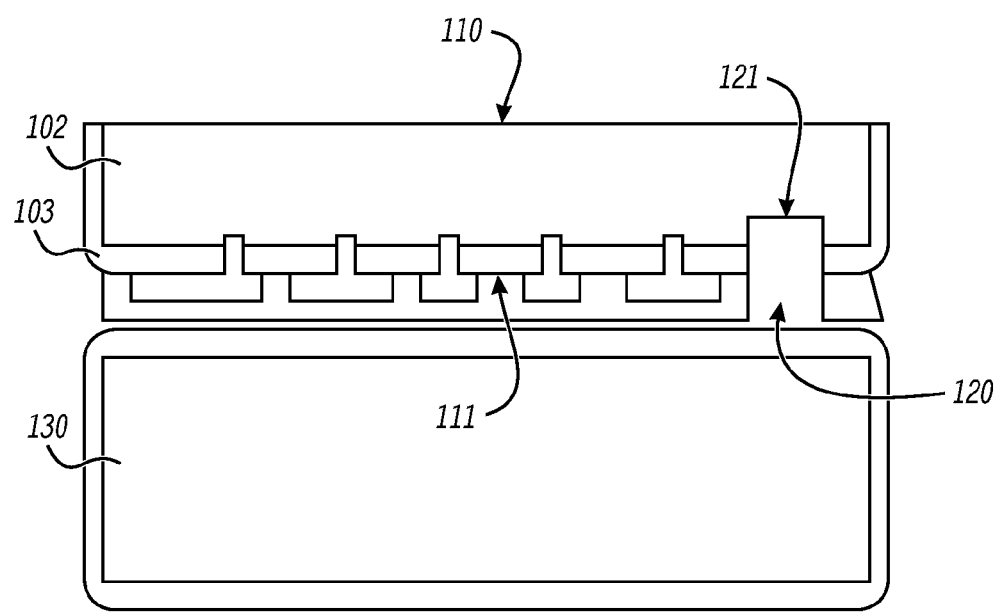
FIG. 8 includes an illustration of a cross-sectional view of the semiconductor substrate of FIG. 7 after grinding of the semiconductor substrate to a defined thickness in accordance with one embodiment of the present disclosure.

In FIG. 8, the portion of the insulating layer 103 that runs along the frontside 110 is removed by etching the layer. In another embodiment the portion of the insulating layer 103 is removed by chemical mechanical polishing (CMP). The substrate 102 is then reduced to a defined thickness between the frontside 110 and the backside 111, which includes a defined thickness between the front side 110 and the bottom 121. In an embodiment, the substrate 102 is reduced to the defined thickness by grinding the frontside 110. In other embodiments, the substrate 102 is reduced in thickness by CMP or by a whole wafer silicon dry etch.

For purposes of discussion, the thickness of the semiconductor substrate 102 between the frontside 110 and the bottom 121 of the cavity 120 is referred to as the cavity region thickness. The thickness of the semiconductor substrate 102 between the frontside 110 and the backside 111 in regions other than the region between the frontside 110 and the bottom 121 is referred to as the general thickness. In one embodiment, the cavity region thickness is 65 percent or less of the general thickness. In another embodiment, the cavity region thickness is 60 percent or less of the general thickness. In another embodiment, the cavity region thickness is 50 percent or less of the general thickness. In another embodiment, the cavity region thickness is 25 percent or less of the general thickness. In one embodiment, the cavity region thickness is 15 micrometers, and the general thickness is 25 micrometers.

Figure 9:
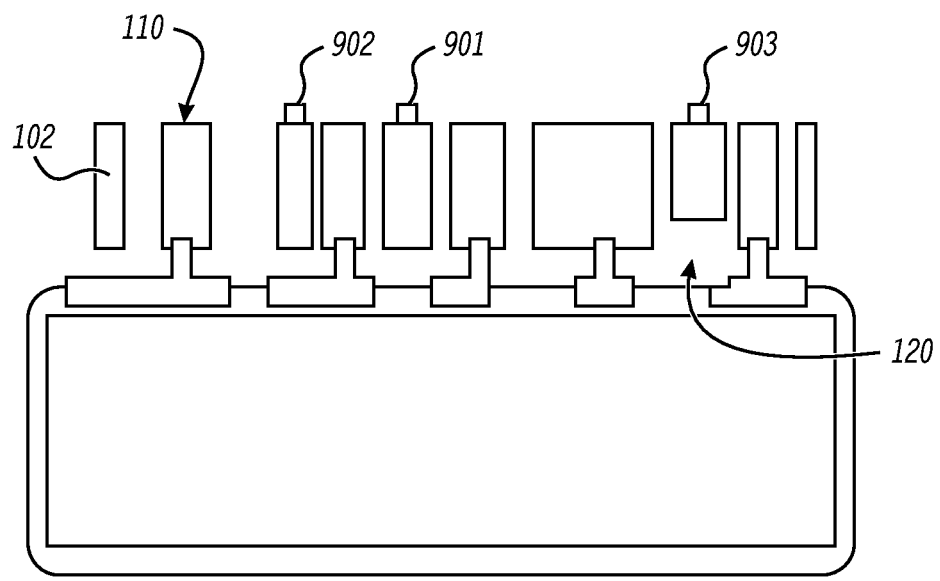
FIG. 9 includes an illustration of a cross-sectional view of the semiconductor substrate of FIG. 8 after formation of accelerometer springs at the semiconductor substrate in accordance with one embodiment of the present disclosure.
Figure 10:
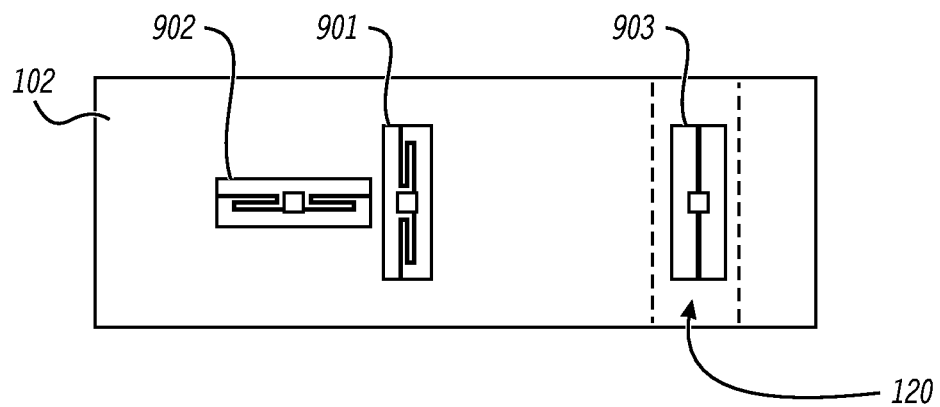
FIG. 10 includes an illustration of a top plan view of the semiconductor substrate of FIG. 8 after formation of accelerometer springs at the semiconductor substrate in accordance with one embodiment of the present disclosure.

FIG. 9 illustrates the semiconductor device after placement of accelerometer springs 901-903. In the illustrated embodiment, the semiconductor substrate 102 has undergone additional etching, and the insulating layer 103 has been etched away. FIG. 10 illustrates a top view of the substrate 102 of FIG. 9. In the top view of FIG. 10, the small white squares indicate anchor points of the substrate 102 that sit on the substrate 130. The black lines in the boxes of springs 901-903 illustrate the shape of the respective spring. The accelerometer spring 901 is a transducer device generally arranged to provide an electrical signal indicative of acceleration along an axis, designated the X-axis. Accelerometer spring 902 is a similar transducer device generally arranged to provide an electrical signal indicative of acceleration along a different axis, designated the Y-axis. Accelerometer spring 903 is a transducer device generally arranged to provide an electrical signal indicative of acceleration along a third axis, designated the Z-axis.

Accelerometer springs 901 and 902 are not formed over the cavity 120. Accordingly, the behavior the springs 901 and 902 is determined, at least in part, by the general thickness of the semiconductor substrate 102. The accelerometer spring 903 is formed over the cavity 120, such that its behavior is determined, at least in part, by the cavity region thickness of the semiconductor substrate 102. To illustrate, in one embodiment the mechanical sensitivity of the accelerometer springs 901 and 902 (for the X and Y axes respectively) is not dependent on the thickness of the substrate. The electrical sensitivity of the accelerometers 901 and 902 can be linearly proportional to thickness of the substrate. Therefore, in some cases a thicker increases the sensitivity of the accelerometer spring 901 and 902. The dependence of the mechanical sensitivity of the accelerometer spring 903 (for the Z-axis) on substrate thickness can vary with different designs and in some cases is inversely proportional to the thickness, or thickness to the power of a positive number between 0-2, of the substrate over which the accelerometers are formed. Accordingly, forming the accelerometer springs 901-903 at a substrate having uniform thickness can impose undesirable design restraints for Z-axis accelerometers. By forming the accelerometer springs 901 and 902 at thicker regions of the semiconductor substrate 102, and forming the accelerometer spring 903 at the thinner region over the cavity 120, the accelerometers can be formed to have similar sensitivities.

Note that not all of the activities described above in the general description or the examples are required, that a portion of a specific activity may not be required, and that one or more further activities may be performed in addition to those described. Still further, the order in which activities are listed is not necessarily the order in which they are performed.

Certain features that are, for clarity, described herein in the context of separate embodiments, may also be provided in combination in a single embodiment. Conversely, various features that are, for brevity, described in the context of a single embodiment, may also be provided separately or in any subcombination. Further, reference to values stated in ranges includes each and every value within that range.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

The specification and illustrations of the embodiments described herein are intended to provide a general understanding of the structure of the various embodiments. The specification and illustrations are not intended to serve as an exhaustive and comprehensive description of all of the elements and features of apparatus and systems that use the structures or methods described herein. Separate embodiments may also be provided in combination in a single embodiment, and conversely, various features that are, for brevity, described in the context of a single embodiment, may also be provided separately or in any subcombination. Further, reference to values stated in ranges includes each and every value within that range. Many other embodiments may be apparent to skilled artisans only after reading this specification. Other embodiments may be used and derived from the disclosure, such that a structural substitution, logical substitution, or another change may be made without departing from the scope of the disclosure. Accordingly, the disclosure is to be regarded as illustrative rather than restrictive.

What is claimed is:

1. A method, comprising:
   providing a substrate having a first major surface and a second major surface;
   removing a first portion of the substrate to form a cavity at the first major surface of the substrate;
   bonding the first major surface of the substrate to a carrier substrate after forming the cavity;
   reducing a thickness of the substrate such that the substrate has a first thickness between the second major surface and a bottom of the cavity and a second thickness between the first major surface and the second major surface after the thickness is reduced, the first thickness less than the second thickness;
   forming a first accelerometer device at the second major surface such that at least a portion of the first accelerometer device is over the cavity; and
   forming a second accelerometer device at the second major surface such that the second accelerometer device is not disposed over the cavity.

2. The method of claim 1, wherein the first thickness is less than 65 percent of the second thickness.

3. The method of claim 1, wherein the first thickness is less than 60 percent of the second thickness.

4. The method of claim 1, wherein the first thickness is less than 25 percent of the second thickness.

5. The method of claim 1, wherein the portion of the first accelerometer device comprises an accelerometer spring.

6. The method of claim 1, wherein the second accelerometer device comprises an accelerometer spring.

7. The method of claim 1, wherein reducing the thickness comprises grinding the semiconductor substrate.

8. The method of claim 1, further comprising forming a polysilicon layer over a portion of the first major surface prior to bonding the first side to the carrier substrate.

9. The method of claim 8, further comprising depositing a dielectric layer over the polysilicon layer.

10. The method of claim 1, wherein the first accelerometer device is associated with a first direction and wherein the second accelerometer device is associated with a second direction different from the first direction.

11. The method of claim 10, further comprising forming a third accelerometer device at the second major surface such that at least a portion of the third accelerometer is not disposed over the bottom of the cavity.

12. The method of claim 11, wherein the portion of the third accelerometer device comprises an accelerometer spring.

13. The method of claim 11, wherein the third accelerometer device is associated with a third direction different from the first and second directions.

14. A method, comprising:
   bonding a first major surface of a substrate to a carrier substrate, the substrate having the first major surface and a second major surface, the substrate including a cavity at the first major surface;
   removing material from the second major surface of the substrate such that the substrate has a first thickness between the second major surface and a bottom of the cavity and a second thickness between the first major surface and the second major surface after the material is removed, the first thickness less than the second thickness;
   forming a first accelerometer device from the second major surface such that an accelerometer spring of the first accelerometer device is over the cavity; and
   forming a second accelerometer device and a third accelerometer device from the second major surface such that the second accelerometer device and the third accelerometer device are not disposed over the cavity, the first, second and third accelerometer devices associated with different directions of three directions.

15. The method of claim 14, wherein the first thickness is less than 65 percent of the second thickness.

16. The method of claim 14, wherein removing the material comprises grinding the semiconductor substrate.

17. The method of claim 14, further comprising forming a polysilicon layer over a portion of the first major surface prior to bonding the first side to the carrier substrate.

* * * * *